(12) United States Patent
Golonzka et al.

(10) Patent No.: US 7,768,074 B2
(45) Date of Patent: Aug. 3, 2010

(54) DUAL SALICIDE INTEGRATION FOR SALICIDE THROUGH TRENCH CONTACTS AND STRUCTURES FORMED THEREBY

(75) Inventors: Oleg Golonzka, Beaverton, OR (US); Bernhard Sell, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 12/319,209

(22) Filed: Dec. 31, 2008

(65) Prior Publication Data

US 2010/0164002 A1    Jul. 1, 2010

(51) Int. Cl.
    *H01L 23/62* (2006.01)
(52) U.S. Cl. ............... 257/384; 257/382; 257/369
(58) Field of Classification Search ......... 257/384, 257/347, 371, 382, 775; 438/154, 183, 197, 438/199, 231, 275
See application file for complete search history.

(56) References Cited

U.S. PATENT DOCUMENTS

| 7,659,631 | B2 * | 2/2010 | Kamins et al. ............ 257/775 |
| 2003/0148563 | A1 * | 8/2003 | Nishiyama ................ 438/197 |
| 2004/0142567 | A1 * | 7/2004 | Nakajima et al. .......... 438/689 |
| 2006/0220141 | A1 * | 10/2006 | Besser ..................... 257/371 |
| 2006/0286729 | A1 * | 12/2006 | Kavalieros et al. ........ 438/183 |
| 2008/0029815 | A1 * | 2/2008 | Chen et al. ................ 257/347 |

* cited by examiner

*Primary Examiner*—Thanh V Pham
*Assistant Examiner*—Errol Fernandes
(74) *Attorney, Agent, or Firm*—Kathy J. Ortiz

(57) ABSTRACT

Methods and associated structures of forming a microelectronic device are described. Those methods may include forming an NMOS silicide on an NMOS source/drain contact area, forming a first contact metal on the NMOS silicide, polishing the first contact metal to expose a top surface of a PMOS source/drain region, and forming a PMOS silicide on the PMOS source/drain region.

15 Claims, 5 Drawing Sheets

DUAL SALICIDE INTEGRATION FOR SALICIDE THROUGH TRENCH CONTACTS AND STRUCTURES FORMED THEREBY

BACKGROUND OF THE INVENTION

Contact to gate shorts have become an increasingly difficult problem for integrated circuits with scaled dimensions. While a metal gate process which forms a salicide through the contact hole may be beneficial in reducing such shorts, a process which yields smaller contact resistances and therefore lower external resistance is desirable for both NMOS and PMOS devices.

BRIEF DESCRIPTION OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

DETAILED DESCRIPTION OF THE PRESENT INVENTION

Figure 1A:
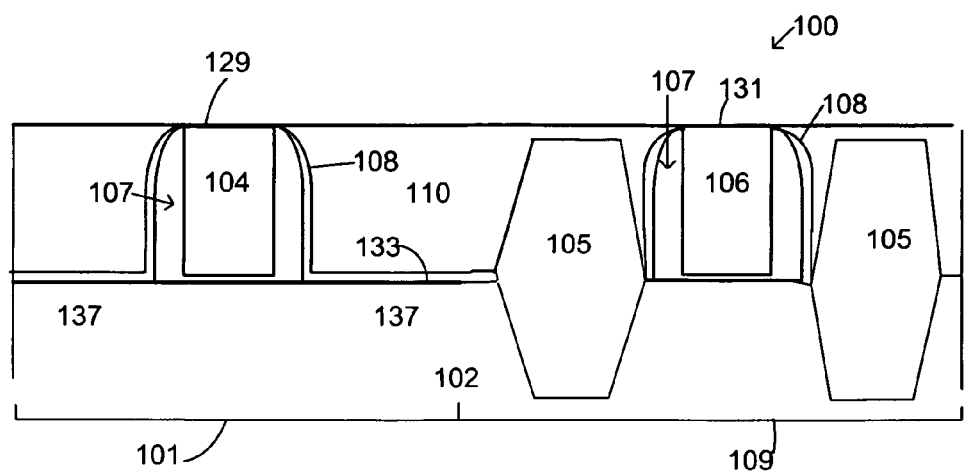
FIGS. 1a-1g represent structures according to an embodiment of the present invention.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein, in connection with one embodiment, may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

Methods and associated structures of forming a microelectronic structure are described. Those methods may include forming an NMOS silicide on an NMOS source/drain contact area, forming a first contact metal on the NMOS silicide, polishing the first contact metal to expose a top surface of a PMOS source/drain region, and forming a PMOS silicide on the PMOS source/drain region. Methods of the present invention enable the formation of separate silicides for N and P diffusion regions, which will yield smaller contact resistances and therefore lower external resistance for NMOS and PMOS devices. Additionally, improved contact to gate margin of the various embodiments will result in improved process yields.

Methods of the present invention are depicted in FIGS. 1a-1g. FIG. 1a shows a cross section of a portion of a structure 100, such as a transistor structure, for example, which may comprise a substrate 102. The substrate 102 may be comprised of materials such as, but not limited to, silicon, silicon-on-insulator, germanium, indium antimonide, lead telluride, indium arsenide, indium phosphide, gallium arsenide, gallium antimonide, or combinations thereof. The substrate 102 may comprise an NMOS portion 101 and a PMOS portion 109. The NMOS portion 101 of the substrate 100 may comprise an NMOS gate 104 and the PMOS portion 109 of the substrate 102 may comprise a PMOS gate 106. The NMOS portion 101 of the substrate 102 may comprise NMOS source/drain regions 137.

In an embodiment, at least one of the PMOS and NMOS gates 104, 106 may comprise a metal gate. In an embodiment, the metal gate may comprise such metal gate materials as hafnium, zirconium, titanium, tantalum, or aluminum, or combinations thereof, for example. The structure 100 may further comprise a spacer material 107, that may be adjacent and in direct contact with the NMOS and PMOS gates 104, 106. The spacer material 107 may comprise a dielectric material in some cases, such as but not limited to silicon dioxide and/or silicon nitride materials.

The structure 100 may further comprise a nitride etch stop layer (nesl) 108, that may be adjacent and in direct contact with the spacer material 107 of both the NMOS and PMOS gates 104, 106, in some embodiments. The nesl 108 may serve as an etch stop layer in some embodiments. The structure 100 may further comprise a first interlayer dielectric (ILD) 110 that may serve as an isolation layer in some embodiments, and may be disposed adjacent to and in direct contact with the nesl 108 in some cases.

Figure 1B:
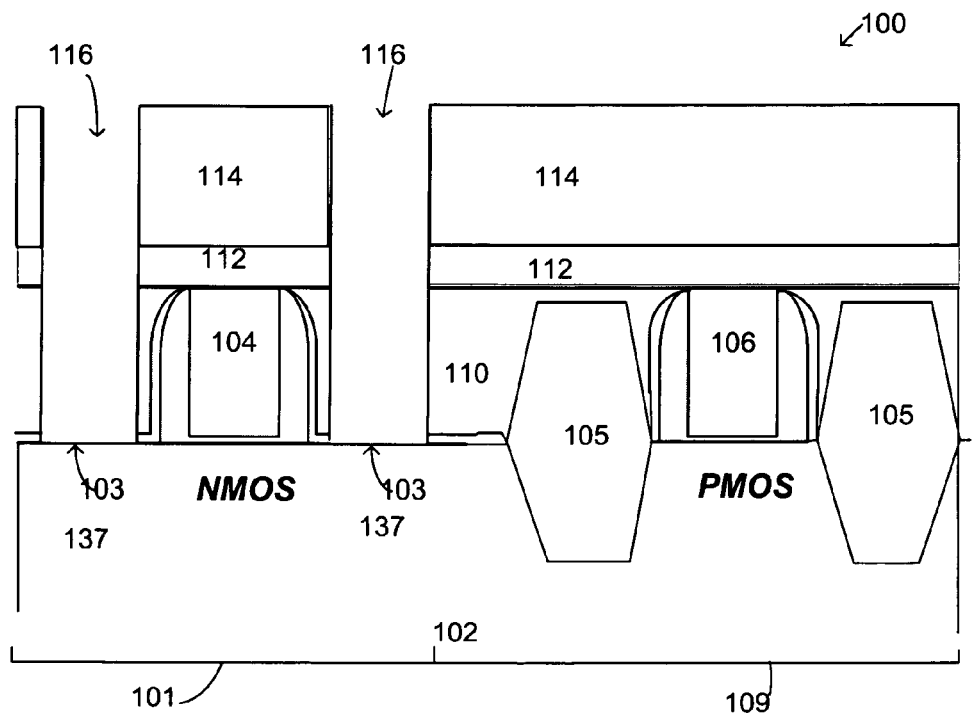

The PMOS portion 109 of the substrate 102 may comprise raised source/drain regions 105. In an embodiment, the raised source/drain regions 105 may comprise epitaxially grown silicon raised source/drain regions wherein a portion of the raised source/drain regions 105 are raised above a top surface 133 of the substrate 102, and wherein a portion of the raised source/drain regions 105 may be adjacent to/within the ILD 110. A sacrificial stopping layer 112 may be formed on a top surface 129 of the NMOS gate 104 and on a top surface 131 of the PMOS gate 106 (FIG. 1b). The sacrificial stopping layer 112 may comprise a nitride and/or a silicon carbide material in some cases.

A resist layer 114 may be formed and patterned on the stopping layer 112 utilizing any suitable patterning process, such as a photolithography process, for example. The resist layer 114 may be formed/patterned to define openings 116, such as NMOS trench contact openings 116, in which NMOS source/drain contact areas 103 of the NMOS portion 101 of the substrate 100 may be subsequently exposed by an ILD etch process, for example. The resist layer 114 may cover/mask the PMOS portion 109 of the substrate 102, such that only the NMOS contact openings 116 are formed.

In an embodiment, a dry etch process may be utilized to form the NMOS contact openings 116, in which unmasked portions of the stopping layer 112 and the first ILD 110 may be removed. In an embodiment, the etching process may comprise an oxide etch that may be selective to the nesl 108 and to the spacer material 106, and may remove a portion of the first ILD 110 in a substantially anisotropic manner, leaving the adjacent nesl 108 and the spacer material 107 substantially intact. The nest 108 may then be subsequently removed to expose the NMOS source/drain contact areas 103. The particular etch process parameters may depend upon the particular application.

Figure 1C:
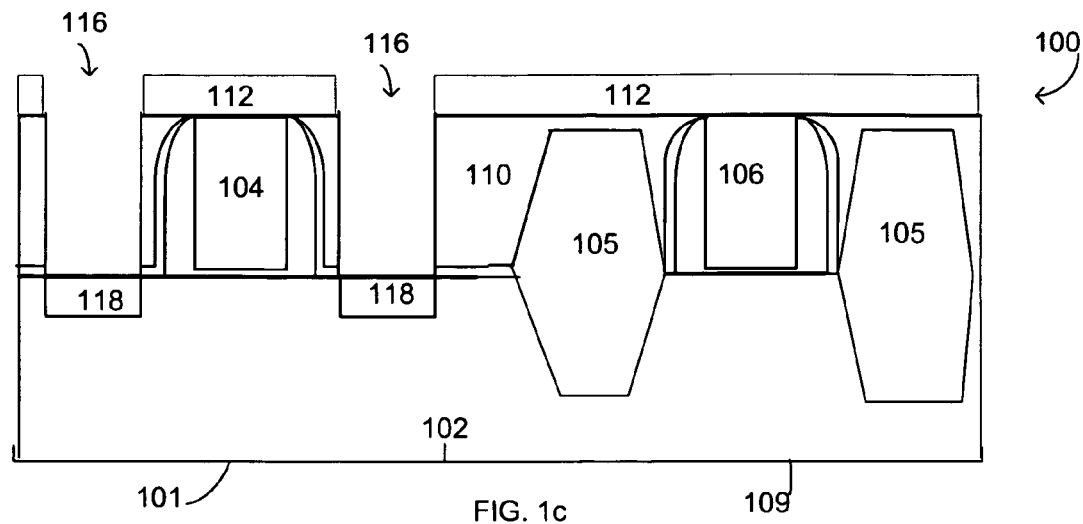

The resist layer 114 may then be removed and an NMOS salicide 118 may be formed on/in the NMOS source/drain contact areas 107/source/drain regions 137 using any suitable salicide process as are known in the art, such as but not limited to a nickel salicide process and/or other such salicide process (FIG. 1c). In an embodiment, the NMOS salicide 118 may comprise a material composition that is optimized for the n-type material of the NMOS portion 101 of the substrate 102. For example, by illustration and not limitation, the NMOS salicide 118 may comprise at least one of erbium, terbium, ytterbium and yttrium. Since the PMOS portion 109 of the substrate, including the PMOS source/drain regions 105, are covered by the stopping layer 122 and the ILD 110 during the silicide process, a salicide does not form on the PMOS source/drain regions 105.

Figure 1D:
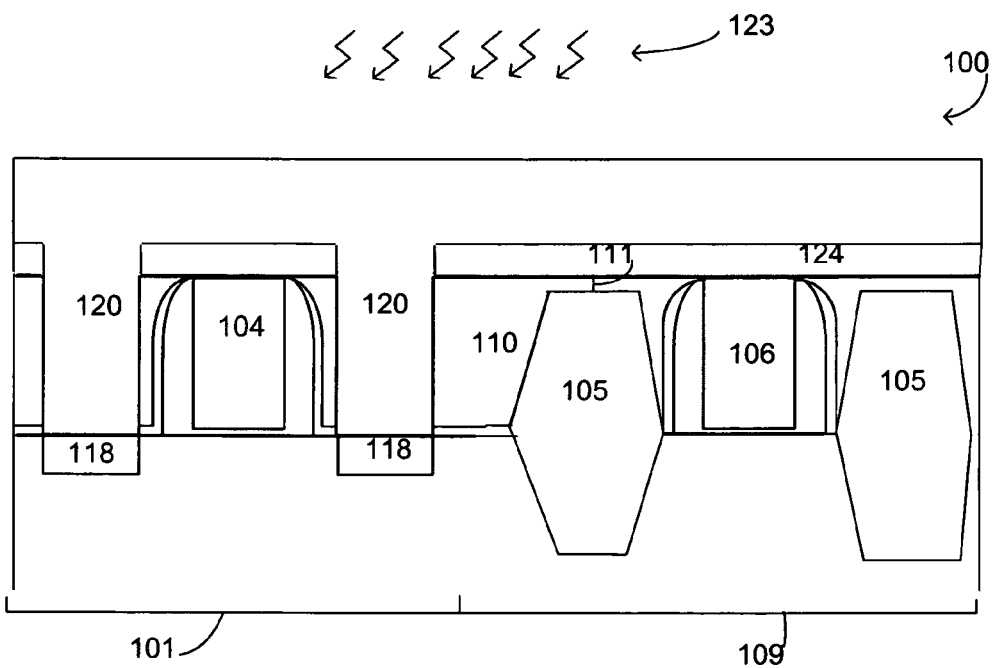

A first contact metal 120 may be formed on the salicide 118 and may fill the NMOS contact openings 116 (FIG. 1d). In an embodiment, the first contact metal 120 may be formed utilizing a process possessing good gap fill properties to ensure that there are little to no voids formed in the contact opening 116. Such a process may include a chemical vapor deposition (CVD) process or an atomic layer deposition (ALD), for example. The first contact metal may comprise at least one of tungsten, titanium, titanium nitride, copper and titanium tungsten in some cases, but may comprise any suitable contact material, according to the particular application. In an embodiment, the first contact metal 120 may comprise a non-tapered first contact metal 120.

Figure 1E:
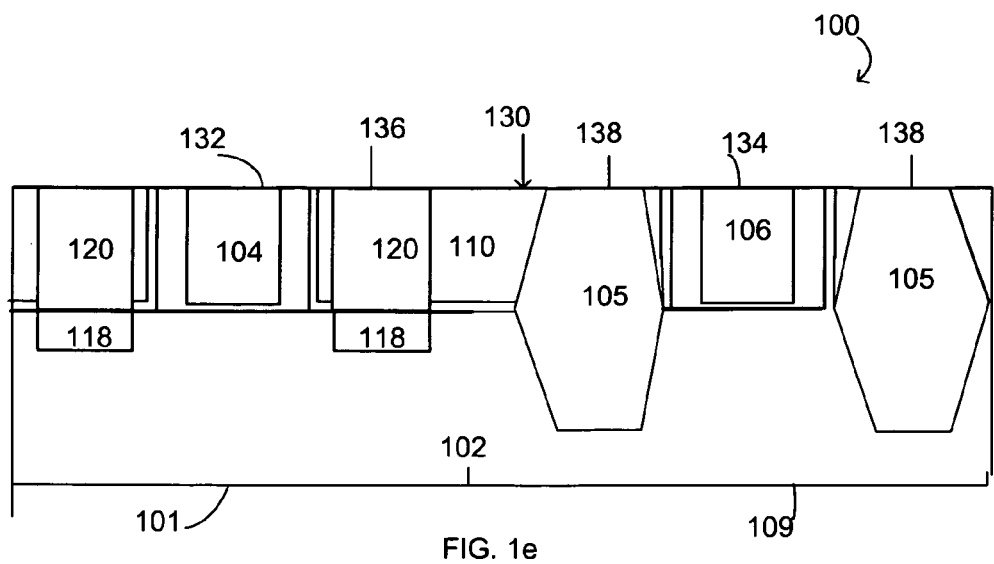

A polishing process 123 may subsequently be performed, such as a chemical mechanical polishing (CMP) process, for example, to remove a portion of the first contact metal 120, the stopping layer 112 and a portion/depth 111 of the ILD 110 (FIG. 1e). In an embodiment, the polishing process 123 may planarize the top surface of the structure 100. In an embodiment, a top surface 136 of the first contact metal 120 may be planarized with a top surface 130 of the ILD 110, a top surface 132 of the NMOS gate 104 and a top surface 134 of the PMOS gate 106.

The polishing process 123 may comprise a sufficient amount of overpolish time so that any stringers that could connect the first contact metal 120 with the gates 104, 106 of the structure 100 may be removed. Additionally, since the polishing process 123 removes a portion 111 of the ILD 110, any mis-registration of the resist layer 114 may be corrected for, thus shorts that may have formed between the first contact metal 120 and the gates 104, 106 due to resist layer 114 misalignment may be avoided.

Figure 1F:
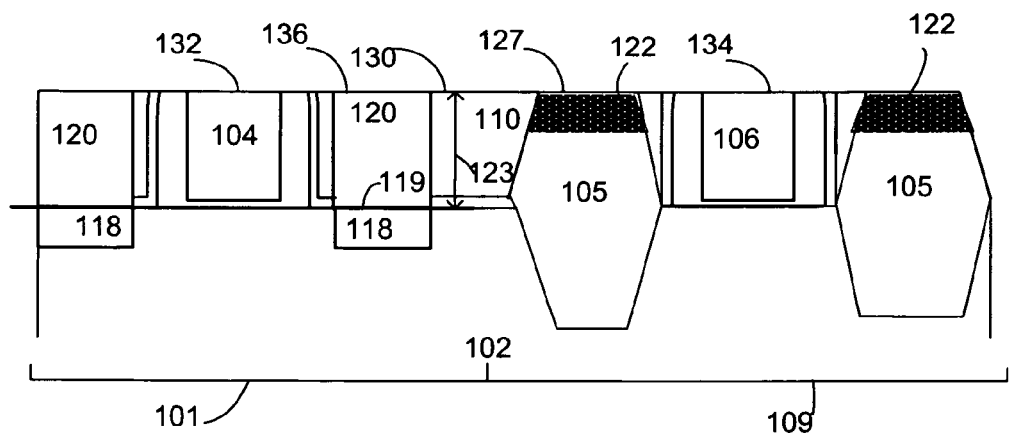

Polishing the first contact metal 120 by utilizing the polishing process 123 may also expose a top surface 138 of the PMOS source/drain regions 105. A PMOS salicide 122 may then be formed on/in the PMOS source/drain regions 105 using any suitable salicide process as are known in the art (FIG. 1f). In an embodiment, the PMOS salicide 122 may comprise a material composition that is optimized for the p-type material of the PMOS portion 109 of the substrate 102. In an embodiment, by illustration and not limitation, the PMOS silicide may comprise at least one of platinum iridium, palladium, rhodium and ruthenium.

Since the NMOS diffusion areas/NMOS silicide 118 of the NMOS portion 101 of the substrate 102, is covered by the first contact metal 120 during the PMOS silicide process, the NMOS salicide 118 is not affected by the PMOS silicidation process. Thus, different chemical composition silicides for NMOS and PMOS diffusion contacts are enabled according to the various embodiments of the present invention. For example, the NMOS silicide 118 may comprise a different material composition than the PMOS silicide 122.

In an embodiment, a top surface 127 of the PMOS silicide 122 is substantially planar with the top surface 136 of the first contact metal 120, the top surface 130 of the ILD 110, the top surface 132 of the NMOS gate 104 and the top surface 134 of the PMOS gate 106. In an embodiment, there is a distance 123 between a top surface 119 of the NMOS silicide 118 and the top surface 127 of the PMOS silicide 122. The first contact metal 120 does not contact the PMOS silicide 122.

Figure 1G:
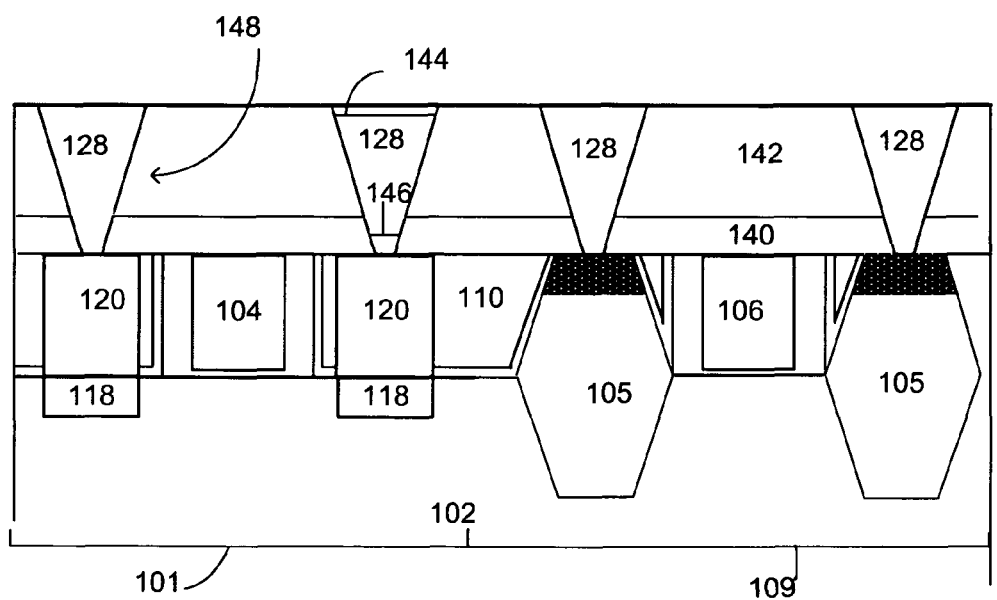

An additional gate etch stop layer 140 may be formed on the top surface 127 of the PMOS silicide 122, the top surface 136 of the first contact metal 120, the top surface 130 of the ILD 110, the top surface 132 of the NMOS gate 104 and the top surface 134 of the PMOS gate 106 (FIG. 1g). A second ILD 142 may be formed on the additional gate etch stop layer 140. A second opening may be formed (not shown) that may be filled with a second contact metal 128. The second contact metal 128 may be conductively coupled/disposed on a portion of the top surface 127 of the PMOS silicide 122 and may form an ohmic contact with the PMOS silicide 122.

The second contact metal 128 may also be conductively coupled and may form an ohmic contact with the first contact metal 120, and may be disposed on a portion of the top surface 136 of the first contact metal 120. The second opening may be formed such that the second contact metal 128 can be tapered and a bottom portion of the second contact metal 128 can be very small compared to a top portion of the second contact metal 128.

In an embodiment, the top portion comprises a larger diameter 144 than a diameter 146 of the bottom portion of the second contact metal 128. The large taper of the second contact metal 128 may increase the contact-to-gate registration window significantly compared to prior art single contact processes. Thus, a stacked contact structure 148 may be formed that is higher than the gates 104, 106. The metal to metal contact of the first contact structure 120 and the second contact structure 128 affords much more flexibility on the shape of the stacked contact structure 133 (that may comprise a vertically stacked dual contact structure) within a transistor structure, thus increasing the amount of misregistration error process window without creating the possibility of touching (shorting) the gates 104, 106.

Figure 2:
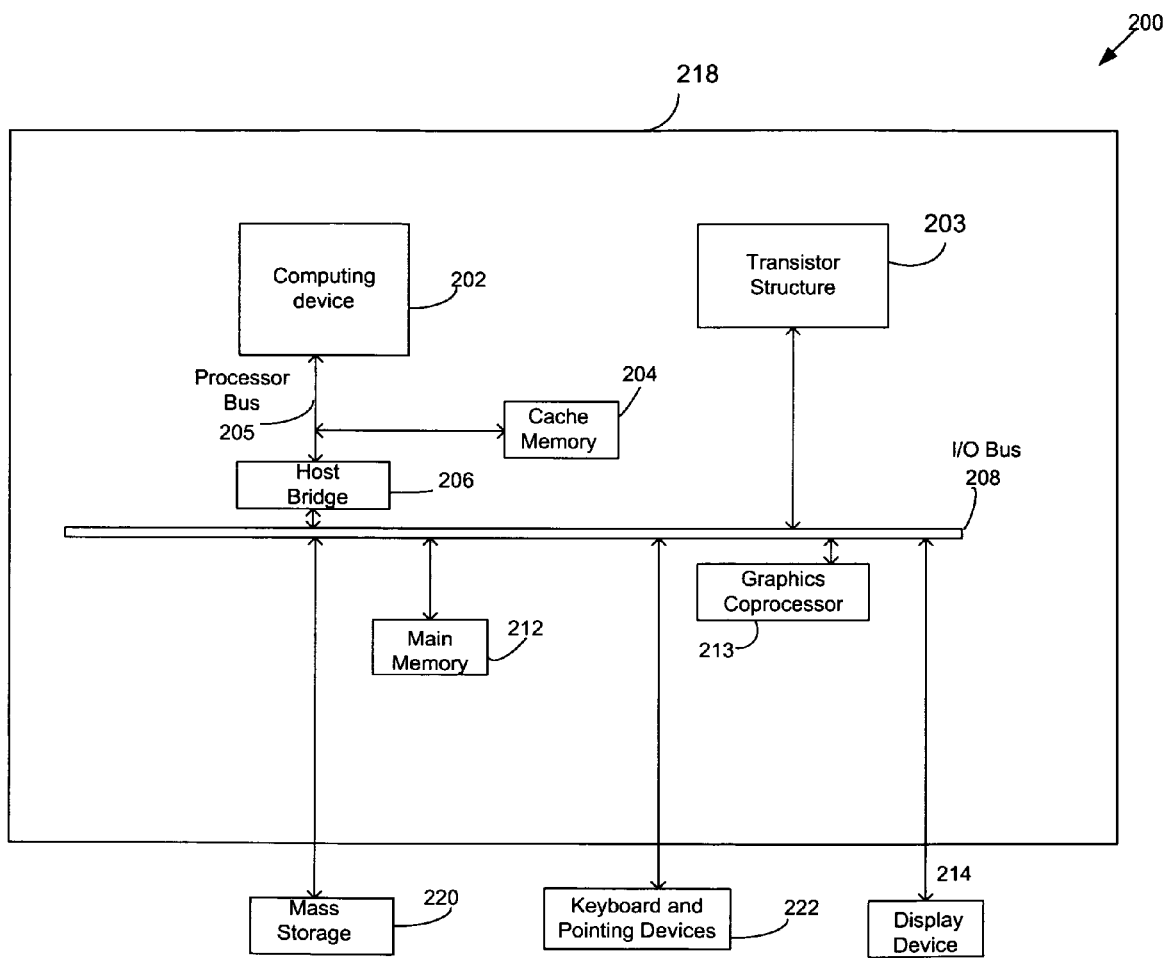
FIG. 2 represents a system according to an embodiment of the present invention.

FIG. 2 is a diagram illustrating an exemplary system 200 capable of being operated with microelectronic structures of the present invention, such as the transistor structure 101 comprising the interconnect structure 216 of FIG. 1g, for example. It will be understood that the present embodiment is but one of many possible systems in which the transistor structure of the present invention may be used.

In the system 200, the transistor structure 224 may be communicatively coupled to a printed circuit board (PCB) 218 by way of an I/O bus 208. The communicative coupling of the transistor structure 224 may be established by physical means, such as through the use of a package and/or a socket connection to mount the transistor structure 224 to the PCB 418 (for example by the use of a chip package, interposer and/or a land grid array socket). The transistor structure 224 may also be communicatively coupled to the PCB 218 through various wireless means (for example, without the use of a physical connection to the PCB), as are well known in the art.

The system 200 may include a computing device 202, such as a processor, and a cache memory 204 communicatively coupled to each other through a processor bus 205. The processor bus 205 and the I/O bus 208 may be bridged by a host bridge 206. Communicatively coupled to the I/O bus 208 and also to the transistor structure 224 may be a main memory 212. Examples of the main memory 212 may include, but are not limited to, static random access memory (SRAM) and/or dynamic random access memory (DRAM), and/or some other state preserving mediums. The system 200 may also include a graphics coprocessor 213, however incorporation of the graphics coprocessor 213 into the system 200 is not necessary to the operation of the system 200. Coupled to the I/O bus 208 may also, for example, be a display device 214, a mass storage device 220, and keyboard and pointing devices 222.

These elements perform their conventional functions well known in the art. In particular, mass storage 220 may be used to provide long-term storage for the executable instructions for a method for forming transistor structure in accordance with embodiments of the present invention, whereas main memory 212 may be used to store on a shorter term basis the executable instructions of a method for forming the transistor in accordance with embodiments of the present invention during execution by computing device 202. In addition, the instructions may be stored, or otherwise associated with, machine accessible mediums communicatively coupled with the system, such as compact disk read only memories (CD-ROMs), digital versatile disks (DVDs), and floppy disks, carrier waves, and/or other propagated signals, for example. In one embodiment, main memory 212 may supply the computing device 202 (which may be a processor, for example) with the executable instructions for execution.

Embodiments of the present invention enable the integration of different chemical composition silicides for N and P diffusion contacts with salicide through trench contact processing. The embodiments can be utilized with dual metal gate processing and provide an added benefit of improved contact to gate shorting margin. Separate silicides for N and P diffusion will yield smaller contact resistances, and therefore lower R external for NMOS and PMOS devices can be realized. Currently single salicide processing is used for N and P diffusions which does not enable optimum performance of the NMOS and PMOS transistor simultaneously.

Although the foregoing description has specified certain steps and materials that may be used in the method of the present invention, those skilled in the art will appreciate that many modifications and substitutions may be made. Accordingly, it is intended that all such modifications, alterations, substitutions and additions be considered to fall within the spirit and scope of the invention as defined by the appended claims. In addition, it is appreciated that certain aspects of microelectronic structures are well known in the art. Therefore, it is appreciated that the Figures provided herein illustrate only portions of exemplary microelectronic structures that pertain to the practice of the present invention. Thus the present invention is not limited to the structures described herein.

What is claimed is:

1. A structure comprising:
    an NMOS silicide disposed on an NMOS source/drain contact area of a substrate;
    a first contact metal disposed on the NMOS silicide; and
    a PMOS silicide disposed on a PMOS source/drain region of the substrate, wherein the NMOS silicide and the PMOS silicide comprise different material compositions from each other, wherein a top surface of the PMOS silicide is substantially planar with a top surface of the first contact metal.

2. The structure of claim 1 further comprising a first contact metal conductively coupled to the NMOS silicide, wherein the first contact metal does not contact the PMOS silicide.

3. The structure of claim 2 further comprising a second contact metal conductively coupled to the first contact metal, wherein the second contact metal comprises a tapered contact metal.

4. The structure of claim 3 wherein the first contact metal and the second contact metal comprise a stacked contact metal structure that is coupled to the NMOS silicide.

5. The structure of claim 1 further comprising a second contact metal that is conductively coupled to the PMOS silicide.

6. The structure of claim 1 wherein the substrate comprises a portion of a transistor comprising dual metal gates.

7. The structure of claim 1 wherein the PMOS source/drain contact comprises a raised PMOS source/drain region.

8. The structure of claim 1 wherein at least one of the first contact metal and the second contact metal comprises at least one of tungsten and titanium and copper.

9. A structure comprising:
    an NMOS silicide disposed on an NMOS source/drain contact area of a substrate;
    a first contact metal disposed on the NMOS silicide; and
    a PMOS silicide disposed on a PMOS source/drain region of the substrate, wherein the first contact metal does not contact the PMOS silicide, wherein a top surface of the PMOS silicide is substantially planar with a top surface of the first contact metal.

10. The structure of claim 9 wherein the NMOS silicide and the PMOS silicide comprise different material compositions from each other.

11. The structure of claim 9 wherein there is a distance between a top surface of the NMOS silicide and a top surface of the PMOS silicide.

12. The structure of claim 11 wherein the NMOS silicide comprises at least one of erbium, terbium, ytterbium and yttrium, and the PMOS silicide comprises at least one of platinum, iridium, palladium, rhodium and ruthenium.

13. The structure of claim 9 wherein the PMOS source/drain region comprises a raised PMOS source/drain region.

14. The structure of claim 9 wherein a second contact metal contacts the PMOS silicide and the NMOS silicide.

15. The structure of claim 9 wherein the substrate comprises a portion of a transistor comprising an NMOS gate and a PMOS gate, wherein the NMOS gate and the PMOS gate comprise metal gates.

* * * * *